(12) United States Patent
Marinca et al.

(10) Patent No.: US 7,543,253 B2
(45) Date of Patent: Jun. 2, 2009

(54) METHOD AND APPARATUS FOR COMPENSATING FOR TEMPERATURE DRIFT IN SEMICONDUCTOR PROCESSES AND CIRCUITRY

(75) Inventors: Stefan Marinca, Dooradoyle (IE); Thomas G. O'Dwyer, Clonlara (IE)

(73) Assignee: Analog Devices, Inc., Norwood, MA (US)

( * ) Notice: Subject to any disclaimer, the term of this patent is extended or adjusted under 35 U.S.C. 154(b) by 514 days.

(21) Appl. No.: 10/680,265

(22) Filed: Oct. 7, 2003

(65) Prior Publication Data

US 2005/0073290 A1 Apr. 7, 2005

(51) Int. Cl.
*G06F 17/50* (2006.01)
*H03K 17/78* (2006.01)
*G05F 3/20* (2006.01)

(52) U.S. Cl. .................. 716/3; 716/1; 716/4; 327/512; 327/540; 323/313; 323/315

(58) Field of Classification Search .............. 716/1–21; 702/130–133; 327/513, 538, 540; 326/31–34; 323/312; 257/48

See application file for complete search history.

(56) References Cited

U.S. PATENT DOCUMENTS

| | | | |
|---|---|---|---|
| 4,399,398 A | 8/1983 | Wittlinger | |
| 4,475,103 A * | 10/1984 | Brokaw et al. | .............. 340/501 |
| 4,603,291 A | 7/1986 | Nelson | |
| 4,714,872 A | 12/1987 | Traa | |
| 4,808,908 A | 2/1989 | Lewis et al. | |
| 4,939,442 A | 7/1990 | Carvajal et al. | |
| 5,053,640 A | 10/1991 | Yum | |
| 5,119,015 A | 6/1992 | Watanabe | |
| 5,229,711 A | 7/1993 | Inoue | |
| 5,325,045 A | 6/1994 | Sundby | |
| 5,352,973 A | 10/1994 | Audy | |
| 5,424,628 A | 6/1995 | Nguyen | |

(Continued)

FOREIGN PATENT DOCUMENTS

EP 0510530 10/1992

(Continued)

OTHER PUBLICATIONS

Zeng et al., "CMOS digital integrated temperature sensor", Oct. 24-27, 2005, ASIC, 2005, ASICON 2005. 6th International Conference On, vol. 1, pp. 248-252.*

(Continued)

*Primary Examiner*—Helen Rossoshek
(74) *Attorney, Agent, or Firm*—Wolf, Greenfield & Sacks, P.C.

(57) ABSTRACT

The present invention provides a method and apparatus for compensating for temperature effects in the operation of semiconductor processes circuitry, such as reference circuits. The method operates on the realization that the second order effects such as "curvature" in the reference voltage variation over a temperature range is removed. The reference voltage variation over a temperature range can be represented as a straight line. This method provides for the trimming of the absolute voltage by scaling the reference voltage at a first temperature to the desired value by a temperature independent voltage. Then, at a second temperature, the output voltage slope is corrected by adding or subtracting a voltage which is always zero at the first temperature.

23 Claims, 5 Drawing Sheets

U.S. PATENT DOCUMENTS

| | | | |
|---|---|---|---|
| 5,512,817 A | 4/1996 | Nagaraj | |
| 5,563,504 A | 10/1996 | Gilbert et al. | |
| 5,646,518 A | 7/1997 | Lakshmikumar et al. | |
| 5,821,807 A * | 10/1998 | Brooks | 327/540 |
| 5,828,329 A * | 10/1998 | Burns | 341/155 |
| 5,933,045 A * | 8/1999 | Audy et al. | 327/513 |
| 5,952,873 A | 9/1999 | Rincon-Mora | |
| 5,982,201 A | 11/1999 | Brokaw et al. | |
| 6,002,293 A * | 12/1999 | Brokaw | 327/540 |
| 6,075,354 A | 6/2000 | Smith et al. | |
| 6,157,245 A | 12/2000 | Rincon-Mora | |
| 6,218,822 B1 | 4/2001 | MacQuigg | |
| 6,225,796 B1 | 5/2001 | Nguyen | |
| 6,255,807 B1 | 7/2001 | Doorenbos et al. | |
| 6,329,804 B1 | 12/2001 | Mercer | |
| 6,329,868 B1 * | 12/2001 | Furman | 327/513 |
| 6,356,161 B1 * | 3/2002 | Nolan et al. | 331/176 |
| 6,373,330 B1 | 4/2002 | Holloway | |
| 6,426,669 B1 | 7/2002 | Friedman et al. | |
| 6,462,625 B2 * | 10/2002 | Kim | 331/57 |
| 6,483,372 B1 | 11/2002 | Bowers | |
| 6,489,787 B1 * | 12/2002 | McFadden | 324/725 |
| 6,489,835 B1 | 12/2002 | Yu et al. | |
| 6,501,256 B1 * | 12/2002 | Jaussi et al. | 323/315 |
| 6,529,066 B1 | 3/2003 | Guenot et al. | |
| 6,531,857 B2 | 3/2003 | Ju | |
| 6,590,372 B1 | 7/2003 | Wiles, Jr. | |
| 6,614,209 B1 | 9/2003 | Gregoire, Jr. | |
| 6,642,699 B1 * | 11/2003 | Gregoire | 323/314 |
| 6,661,713 B1 | 12/2003 | Kuo | |
| 6,664,847 B1 * | 12/2003 | Ye | 327/543 |
| 6,690,228 B1 * | 2/2004 | Chen et al. | 327/538 |
| 6,791,307 B2 * | 9/2004 | Harrison | 323/312 |
| 6,798,286 B2 * | 9/2004 | Dauphinee et al. | 330/129 |
| 6,828,847 B1 * | 12/2004 | Marinca | 327/513 |
| 6,836,160 B2 * | 12/2004 | Li | 327/103 |
| 6,853,238 B1 | 2/2005 | Dempsey et al. | |
| 6,885,178 B2 | 4/2005 | Marinca | |
| 6,891,358 B2 * | 5/2005 | Marinca | 323/316 |
| 6,894,544 B2 * | 5/2005 | Gubbins | 327/143 |
| 6,919,753 B2 * | 7/2005 | Wang et al. | 327/513 |
| 6,930,538 B2 * | 8/2005 | Chatal | 327/539 |
| 6,958,643 B2 * | 10/2005 | Rosenthal | 327/540 |
| 6,987,416 B2 | 1/2006 | Ker et al. | |
| 6,992,533 B2 * | 1/2006 | Hollinger et al. | 331/143 |
| 7,012,416 B2 | 3/2006 | Marinca | |
| 7,057,444 B2 * | 6/2006 | Illegems | 327/541 |
| 7,068,100 B2 * | 6/2006 | Dauphinee et al. | 330/129 |
| 7,088,085 B2 | 8/2006 | Marinca | |
| 7,091,761 B2 * | 8/2006 | Stark et al. | 327/170 |
| 7,112,948 B2 | 9/2006 | Daly et al. | |
| 7,170,336 B2 | 1/2007 | Hsu | |
| 7,173,407 B2 | 2/2007 | Marinca | |
| 7,193,454 B1 | 3/2007 | Marinca | |
| 7,199,646 B1 | 4/2007 | Zupcau et al. | |
| 7,211,993 B2 | 5/2007 | Marinca | |
| 7,224,210 B2 | 5/2007 | Garlapati et al. | |
| 7,236,047 B2 | 6/2007 | Tachibana et al. | |
| 7,248,098 B1 | 7/2007 | Teo | |
| 7,260,377 B2 * | 8/2007 | Burns et al. | 455/341 |
| 7,301,321 B1 | 11/2007 | Uang et al. | |
| 7,372,244 B2 | 5/2008 | Marinca | |
| 7,411,380 B2 | 8/2008 | Chang et al. | |
| 7,472,030 B2 | 12/2008 | Scheuerlein | |
| 7,482,798 B2 | 1/2009 | Han | |
| 2003/0234638 A1 | 12/2003 | Eshraghi et al. | |
| 2005/0194957 A1 | 9/2005 | Brokaw | |
| 2005/0237045 A1 | 10/2005 | Lee et al. | |
| 2006/0017457 A1 * | 1/2006 | Pan et al. | 326/32 |
| 2006/0038608 A1 | 2/2006 | Ozawa | |
| 2008/0018319 A1 | 1/2008 | Chang et al. | |
| 2008/0074172 A1 | 3/2008 | Marinca | |
| 2008/0224759 A1 | 9/2008 | Marinca | |
| 2008/0265860 A1 | 10/2008 | Dempsey et al. | |

FOREIGN PATENT DOCUMENTS

| | | |
|---|---|---|
| EP | 1359490 A2 | 11/2003 |
| EP | 1359490 A3 | 11/2003 |
| JP | 4-167010 | 6/1992 |
| KR | 0115143 | 12/2007 |

OTHER PUBLICATIONS

PCT/EP2008/058685 International Search Report and written opinion, Oct. 1, 2008.

PCT/EP2008/051161 International Search Report and written opinion, May 16, 2008.

Chen, Wai-Kai, "The circuits and filters handbook", 2nd ed, CRC Press, 2003.

Cressler, John D., "Silicon Heterostructure Handbook", CRC Press-Taylor & Francis Group, 2006; 4.4-427-438.

Banba et al, "A CMOS bandgap reference circuit with Sub-1-V operation", IEEE JSSC vol. 34, No. 5, May 1999, pp. 670-674.

Brokaw, A. Paul, "A simple three-terminal IC bandgap reference", IEEE Journal of Solid-State Circuits, vol. SC-9, No. 6, Dec. 1974, pp. 388-393.

Jones, D.A., and Martin, K., "Analog Integrated Circuit Design", John Wiley & Sons, USA, 1997 (ISBN 0-47L-L4448-7, pp. 353-363).

Malcovati et al, "Curvature-compensated BiCMOS bandgap with 1-V supply voltage", IEEE JSSC, vol. 36, No. 7, Jul. 2001.

Sudha et al, "A low noise sub-bandgap voltage reference", IEEE, Proceedings of the 40th Midwest Symposium on Circuits and Systems, 1997. vol. 1, Aug. 3-6, 1997, pp. 193-196.

Widlar, Robert J., "New developments in IC voltage regulators", IEEE Journal of Solid-State Circuits, vol. SC-6, No. 1, Feb. 1971, pp. 2-7.

Gray, Paul R., et al, *Analysis and Design of Analog Integrated Circuits*, Chapter 4, 4th ed., John Wiley & Sons, Inc., 2001, pp. 253-327.

PCT/EP2005/052737 International Search Report, Sep. 23, 2005.

PCT/EP2008/067402 International Search Report, Mar. 20, 2009.

* cited by examiner

Fig. 1

PRIOR ART

METHOD AND APPARATUS FOR COMPENSATING FOR TEMPERATURE DRIFT IN SEMICONDUCTOR PROCESSES AND CIRCUITRY

FIELD OF THE INVENTION

The invention relates to semiconductor processes and circuitry. The invention particularly relates to such circuitry that requires an accurate output over a range of temperatures. The effect of such temperature drift is particularly noticeable in circuitry such as voltage or current reference circuits but may also affect the operation of amplifiers.

BACKGROUND OF THE INVENTION

Figure 1:
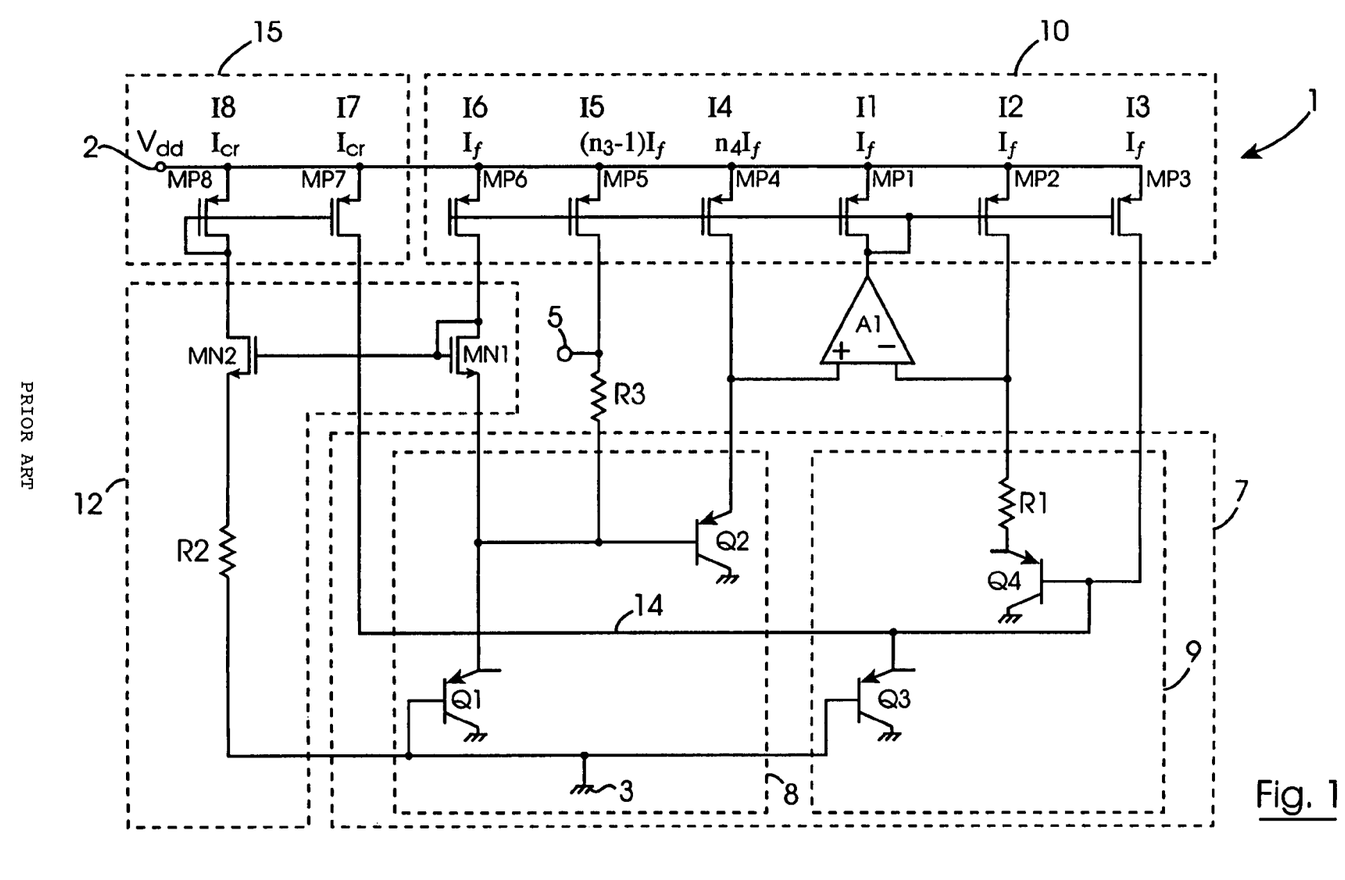
FIG. 1 is an example of a simple prior art reference circuit.

Within the field of semiconductor circuits, certain categories of circuitry require a reliable operation over a range of temperatures. One such circuit which may be used to provide a constant reference source is shown in FIG. 1. This simple circuit is a constant reference circuit that is implemented using a current source 101, producing an output current, which is proportional to absolute temperature (PTAT), coupled via a resistor 102 to a base-emitter voltage of a transistor 103, which is complementary to absolute temperature (CTAT). If the slope of the voltage drop across 102 (PTAT) balances the base-emitter voltage slope (CTAT), the output voltage provided at the common node of the current source 101 and the resistor 102 is substantially constant over temperature. Other known reference sources include those implemented using bandgap techniques.

A problem with providing such reference circuits is that there are a number of parameters which may provide variances in the performance of the reference circuit which leads to errors. For example, as a result of process variations in the transistors implemented in typical reference circuits, the base emitter voltage of the transistors may change. Even if the transistors are set to operate at the same emitter current, this may vary by as much as 10-20 mV, thereby causing errors in the reference output.

Another source of error is due to the typical technique used in the generation of the PTAT voltage in such reference circuits. The PTAT voltage is typically generated by means of a voltage AVBE, being the difference in the base-emitter voltages of two transistors provided in the circuit which operate at different current densities. The value of $\Delta V_{BE}$ is then amplified to produce the required PTAT voltage value for use in such bandgap circuits. As the PTAT voltage is a scaled replica of $\Delta V_{BE}$, any offsets present in the $\Delta V_{BE}$ are also amplified and added, which results in errors. Furthermore, additional errors may be introduced during the packaging of such circuits. For example, the moulding stress that may be applied to the transistor during the packaging may contribute to an additional shift in the reference value.

In typical bandgap voltage references, the output voltage requires trimming or adjusting so as to achieve a constant output voltage reference over a range of temperatures. This is typically achieved by altering the PTAT voltage, as due to the exponential relationship between the current and the base-emitter voltage of a bipolar transistor, it is more difficult to alter the CTAT voltage. Typically, both the absolute voltage and the temperature slope of a bandgap voltage reference must be trimmed, with the assumption that the base-emitter voltage of the bipolar transistor has a precise value at absolute zero. The base emitter voltage at zero Kelvin is known as the bandgap voltage. Due to the process variations, both the output voltage and the temperature slope or temperature coefficient (TC) for a real bandgap voltage reference will have different values from device to device. This causes problems if a precise absolute voltage and minimum temperature coefficient are required. When the PTAT voltage is adjusted at room temperature so as to correct the temperature slope, the adjustment turns the slope around 0 Kelvin, which causes the absolute voltage to also change. Therefore, once the temperature slope has been corrected, the absolute voltage must also be corrected. This correction in absolute voltage may in turn alter the temperature slope. As a result, the trimming process typically requires the step of correction of the temperature slope followed by the step of correction of the absolute voltage to be repeated several times. This means that when a precise absolute voltage and minimum temperature coefficient is required, a lengthy iterative process of trimming slope and absolute voltage must be employed.

Another way to trim the reference voltage is to record a minimum of two reference voltage values at two different temperatures, in order to find the temperature slope, and then to adjust the PTAT voltage by a corresponding amount and shift the reference voltage (or the gain) with a temperature constant value. However temperature trimming of units in production quantities using this technique has the drawback of requiring multiple handling and tracking of the individual units during temperature test.

A number of techniques have been developed to provide for the compensation of the temperature effect. An example of such a technique is disclosed in U.S. Pat. No. 6,075,354 (the content of which is incorporated herein by way of reference). In this document, three currents DAC's are provided to interface with a bandgap voltage generator, a first provided to trim first order temperature slope variations of the output reference voltage, a second to compensate for temperature slope curvature and a third to provide scalar gain adjustment. In order to adjust $\Delta V_{BE}$ for the slope correction, the technique is used of pushing an external correction current through the first or second diode of the main bandgap cell. A drawback of this scheme is that as the PTAT voltage changes, the reference voltage slope also changes, which affects the absolute value of the reference voltage.

Another U.S. Pat. (No. 6,329,804) also describes a slope and level trim DAC for voltage references. In order to trim the reference voltage slope, a current switching DAC is used to inject a PTAT trimming current into one of the two diodes in the main bandgap cell. However, as in the case of U.S. Pat. No. 6,075,354, this patent also has the drawback that a change in $\Delta V_{BE}$ changes both the slope and absolute value of the reference voltage.

There is therefore a need for a method and circuit that provides a simple way of trimming the reference voltage in which both reference voltage and temperature coefficient (or the slope) can be separately adjusted.

OBJECT OF THE INVENTION

It is an object of the present invention to provide method and circuit for compensating for temperature effects during operation of semiconductor circuits to overcome the above mentioned problems. It is a further object to provide an analog and digital solution for carrying out the present invention.

SUMMARY OF THE INVENTION

Accordingly, the present invention, as set out in the appended claims, provides a method for compensating for temperature effects in the operation of semiconductor circuitry comprising the acts or steps of scaling an output value of said circuit to a desired output value at a first temperature and matching said output value, at a second temperature, to said desired output value, whereby said desired output value at said first temperature remains unchanged. In the case of reference voltage, the method is implemented assuming that the second order effects such as "curvature" in the reference voltage variation over temperature range is removed and the reference voltage variation over temperature range is a straight line. According to the proposed method the absolute voltage is trimmed first. At the first or reference temperature (typically room temperature), the reference voltage is scaled to the desired value by a temperature independent voltage. Then, at a second temperature, the output voltage slope is corrected by adding or subtracting a voltage which is always zero at the reference temperature and because of that it has no effect on absolute value. In effect, the invention is based on the analysis that the output is provided by a straight line defined by two points. In the first step, the line is scaled to force it to cross a fixed predetermined point. Then, at a second temperature, the line is rotated about this fixed point.

In a first embodiment, the first step is effected by shifting the reference by a constant value either up or down to a desired output value. This is typically achieved by forcing a constant current through a resistor. The current can be generated by a balanced PTAT/CTAT current or by reflecting the reference voltage across a resistor. In essence, and using the assumption that the output is a straight line defined by the equation $y=mx+c$, then this step can be equated to the addition of "c".

The second step is effected at a different second temperature and the rotation of the slope is achieved by the addition or subtraction of the difference of two balanced trimming PTAT and CTAT currents. These trimming currents are balanced in such a way that at the first temperature their sum or difference is zero and the combined current has a double slope compared to each individual current.

An additional step may be provided between the first and second steps, the additional step adapted to ensure that the difference between the PTAT and CTAT currents at the first temperature is equal to zero. This can be effected by a tuning of the PTAT or CTAT current sources to achieve the balancing between the two.

In another embodiment there is provided a method scaling an output voltage of said circuit to a desired output voltage value at a first temperature by a temperature independent voltage and correcting at a second temperature the slope of a line representative of said desired output voltage over a temperature range to provide said desired output voltage at said second temperature by adding or subtracting a correcting voltage whereby said correcting voltage is always zero at said first temperature, and whereby said desired output voltage value at said first temperature remains unchanged.

In a further embodiment there is provided a semiconductor circuit adapted to provide compensation for temperature effects during operation comprising means for scaling an output of said circuit to a desired output value at a first temperature and means for matching said output value, at a second temperature, to said desired output value, whereby said desired output value at said first temperature remains unchanged.

Ideally the value of a constant current, which generates the constant voltage value is controlled by a current source coupled to a DAC and a value of a user controlled input code applied to said DAC determines the value of the constant current. Multiplexors can be provided whether the constant voltage value is to be added or subtracted.

Preferably the trimming currents are controlled by a first and a second DAC, the output of said first and second DAC connected to at least one multiplexor, whereby a control signal applied to said multiplexor controls the addition or subtraction of said difference. The tuning of the trimming currents is carried out by a tuning DAC coupled to one of said currents, by adjusting a value of a user controlled input to said tuning DAC.

In another embodiment of the present invention there is provided a semiconductor circuit adapted to provide compensation for temperature effects during operation, the circuit comprising a digital control means for digitally scaling an output voltage of said circuit to a desired output voltage value at a first temperature and digitally matching said output voltage value, at a second temperature, to said desired output voltage value, whereby said desired output voltage value at said first temperature remains unchanged.

Preferably the digital control means comprises a register, coupled to the inputs of each DAC, wherein the output values from said register determine the value of the input codes to each DAC. The register can be connected to a digital control unit and memory, the value of said input codes are stored in said memory, and the transfer of said input codes from memory to the register is controlled by said digital control unit.

There is also provided a computer program product comprising a medium having embodied therein program instructions for causing a computer program to carry out any of the above method steps or acts or sequences of steps or acts, which medium may embody on or include a record medium, carrier signal or read-only memory.

The adjustment effected by the present invention may be applied either before or after packaging of the device and as such it will be appreciated that it may be repeated at a later date to compensate for degradation of the performance of the circuitry over time. Such a later repetition of the steps can be used to re-calibrate the circuitry.

DETAILED DESCRIPTION OF THE DRAWINGS

FIG. 1 has been described with reference to the prior art.

The invention will now be described with reference to preferred embodiments as illustrated in FIGS. 2 to 9.

FIGS. 2 to 5 relate plots of different parameters illustrating operation of the compensation circuitry of FIGS. 6 to 9 which are discussed in more detail later in the description.

Figure 6:
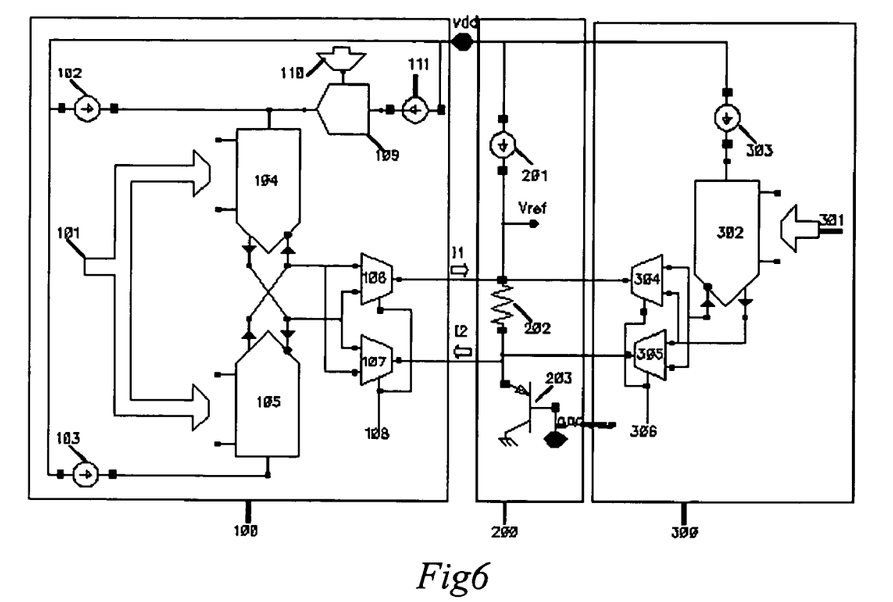
FIG. 6 is a schematic of a circuit according to a first embodiment of the present invention adapted to provide for a temperature compensation of voltage reference circuit.

As shown in FIG. 6, the present invention provides for compensation circuitry adapted to interface with existing voltage reference components so as to provide for a constant voltage reference over a range of temperatures. The invention provides for the compensation circuitry to adjust the voltage reference to provide for a constant voltage reference over a range of temperatures in two stages, namely a first calibration step and a second calibration step.

In FIG. 6, a standard voltage reference block, similar to that shown in FIG. 1, is implemented within the block 200. The voltage reference block 200 includes a PTAT current source 201, coupled via a resistor 202 to a transistor 203, which has its base coupled to ground. The output reference voltage, Vref, is provided at the common node of the current source 201 and the resistor 202. The operation of such a circuit is well known in the art and will not be described herein. According to the present invention two additional blocks are provided, a first block 300 adapted to provide for a scaling of the output of the reference block to a desired reference value, and a second block 100, adapted to enable a rotation of the output temperature slope at a second calibration temperature, so as to provide a voltage reference with a constant value over a temperature range.

As shown in FIG. 6, the first block desirably includes a current DAC 302 being coupled at a first input thereof to a constant current source 303, and having at a second input thereof a series of user-controlled binary inputs 301, the selected value of the inputs determining the value of the output current of the DAC 302. The output current of the DAC 302 is fed via two multiplexors 304, 305 to either side of the resistor 202. The current through resistor 202 can either be scaled up or down by pushing or pulling current from the voltage reference block 200, as can be determined by changing the sign control 306 to the multiplexors. This change in current results in a corresponding increase or decrease in the voltage reference. The sign control effects a change in the pushing or pulling of the current from the voltage reference block so as to scale up or down the voltage reference with a temperature independent amount as required. According to the present invention, the first calibration step involves the adjustment of the reference voltage to the required value in the manner described above at a first temperature, which is typically room temperature.

It will be appreciated that the configuration of the first block 300 as provided in FIG. 6 is effectively a simultaneous push-pull current DAC. That is, the current which is pushed into one side of the resistor 202 is simultaneously pulled back into the DAC from the other side. In all modes of operation there is a simultaneous circulation of current through resistor 202. As a result, there is no modification to the base emitter voltage $V_{BE}$ of the transistor 203.

Once the output voltage reference value is adjusted until the desired output value is reached, the binary numbers 301 are stored into a memory. In a preferred embodiment of this invention the binary numbers 301 are stored in a non-volatile memory such an EEPROM.

Figure 2:
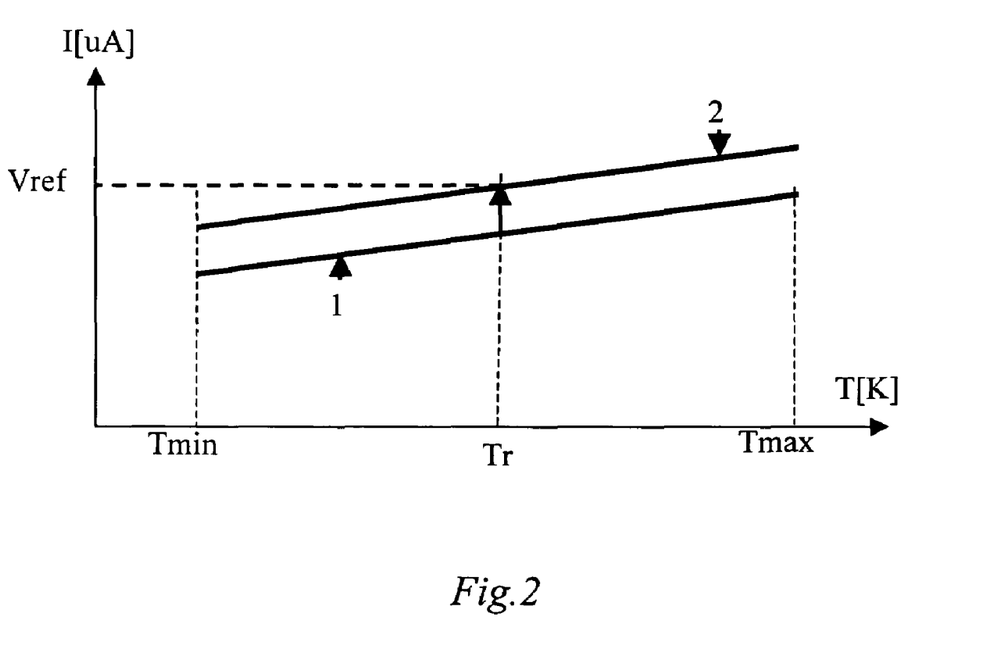
FIG. 2 shows a graph of the relationship between reference voltage and absolute temperature of the circuit both before and after the first trimming step.

FIG. 2 shows a graphical representation of the relationship between the reference voltage and temperature of the circuit both before and after the first calibration step. However the output voltage reference remains prone to temperature drift, whereby any change in the temperature of the circuit will alter the value of the output voltage. Line 1 illustrates a typical change in the value of the reference voltage over a temperature range of Tmin to Tmax. According to the present invention, the reference voltage may be adjusted from its initial value, as shown by line 1, to the required reference value, Vref, at room temperature (Tr) as described above. Line 2 illustrates the relationship between reference voltage and temperature for the new value of output reference voltage, assuming that the adjustment to the voltage reference was made at room temperature, Tr. It will be appreciated from an examination of line 2, that the output reference voltage remains prone to temperature drift. A function of the second control block 100 is to reduce this temperature slope to zero, so as to provide a constant reference voltage over a temperature range.

Referring again to FIG. 6, once the reference voltage has been set in the first calibration step to the required level by means of the first control block 300, the second control block 100 can be activated to provide for the second calibration step. The second control block 100 provides two main functions; it provides for the balancing of the PTAT and CTAT circuit currents, and it also is responsible for the adjusting of the temperature slope to zero.

The second control block includes a first and second current source 102, 103, one PTAT and one CTAT. The two current sources 102, 103 are then individually coupled to respective DACs 104, 105. DACs 104 and 105 are controlled by a common binary input code 101. The outputs of the DACs are cross-coupled and are fed as inputs to multiplexors 106, 107. The operation of the multiplexors are controlled by a common control signal 108. It can be seen that one of the inputs to the multiplexors 106, 107 is a current having the value of the difference between the CTAT and PTAT currents, while the other input is the same current with opposite sign. A further current source, 111, acts as an input to a DAC 109, the output of which is fed to DAC 104. A binary input 110 controls the operation of the tuning DAC 109.

In order to ensure that each of the current sources 102, 103 are matched, and therefore do not contribute to errors in the performance of the voltage reference block, it is desirable that at a first temperature the PTAT and CTAT currents are balanced to produce a zero difference. Once the voltage reference has been set using the first control block 300 at the first temperature, typically room temperature, an alteration of the current through DACs 104, 105 by means of control 101 should not effect the reference voltage, if the circuit is balanced.

Figure 3:
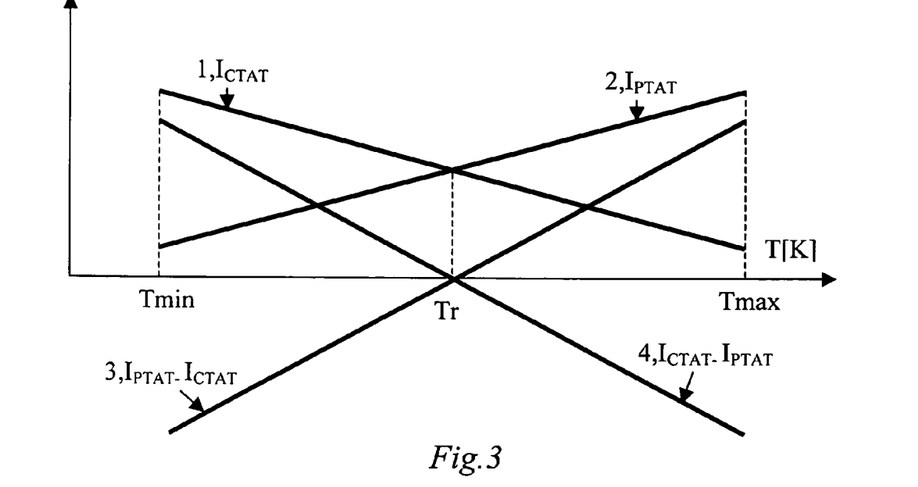
FIG. 3 shows a plot of the PTAT and CTAT currents when well-balanced and two trimming currents.

FIG. 3 shows a plot of a typical PTAT current 2 and CTAT current 1 when they have been balanced. The graph also shows a plot of a current 3 being the difference between the PTAT and CTAT currents and a current 4 being the difference between the CTAT and PTAT currents. It can be seen from this graph that at room temperature, Tr, if the currents are balanced, the difference between the PTAT and CTAT currents should be zero. This fact is employed in the second control block 100 in order to balance the currents.

In order to check whether the PTAT and CTAT currents are balanced, the control 110 for the current through tuning DAC 109 and the control 101 for DACs 104 and 105 should be set to a minimum at the first temperature, and the value of the reference voltage, Vref, recorded. Once Vref is recorded, control 101 can be set to its maximum value, and the value of Vref monitored. If the value of Vref changes when the control value 101 is changed, this implies that the PTAT and CTAT currents are not balanced. This is because, if the value of PTAT and CTAT currents were equal, the input currents to the multiplexors 106 and 107, being the difference between CTAT and PTAT currents as described earlier, should be zero at this first temperature, as explained with reference to FIG. 3. If the value of Vref does change on the alteration of the control 101, it is indicative that the current is not balanced. The currents should then be adjusted to balance. This is achieved by altering the control 110 to enable the PTAT and CTAT current sources to be tuned relative to one another. The altering of the control 110 varies the current flowing through DAC 109. When the PTAT and CTAT currents are balanced the control value 110 is stored into the memory and Vref remains at the same value on an alteration of control 101.

The main function of the second control block 100 is to reduce the temperature slope of the circuit to zero, so that the voltage reference will remain constant over a temperature range. This is the second calibration step of the invention. The step of reducing the temperature slope to zero is carried out by altering the temperature of the circuit from the first temperature to a second temperature, and adjusting the voltage reference until the output voltage for this second temperature is the same as the required voltage at the first temperature. During this step, the temperature of the circuit should be increased to a second temperature, and the output of the voltage reference circuit Vref monitored. It will be noted that with the increase in circuit temperature, the value of the output voltage shifts if the digital input 101 is zero. This can be corrected by effecting a rotation of the line defining the output, so that the temperature slope becomes zero. Such rotation is effected by applying a variable input code 101 from the second control block 100 until the desired value is once again reached. Once this has been achieved the control value 101 is stored into the memory and the temperature slope should remain at zero over the entire temperature range of interest.

Figure 4:
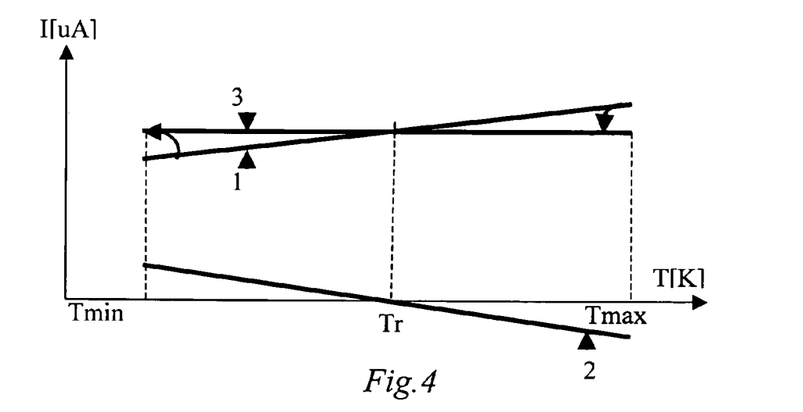
FIG. 4 show a graphical representation of the process of adjusting a positive temperature slope.
Figure 5:
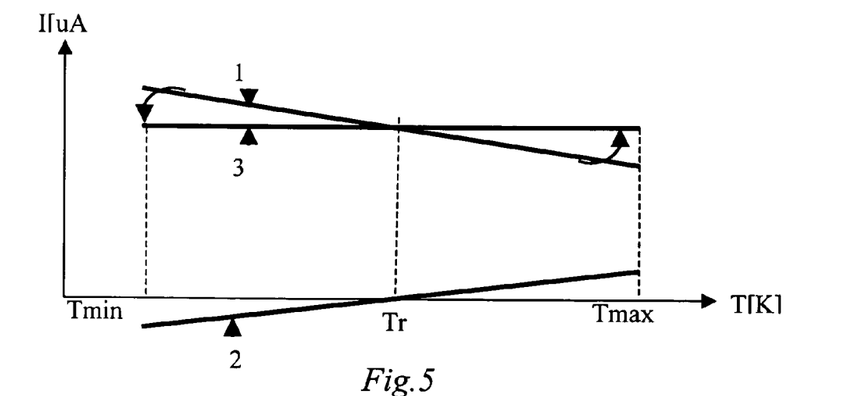
FIG. 5 show a graphical representation of the process of adjusting a negative temperature slope.

FIGS. 4 and 5 show a graphical representation of this process of adjusting for temperature slope. FIG. 4 shows a representation for an adjustment of a positive temperature slope. In FIG. 4, the voltage reference has initially a positive temperature slope, shown by line 1, so that when the temperature of the circuit is increased to a second temperature, Tmax, the output reference voltage value increases. The second control block 100 can alleviate this temperature slope by pulling or pushing a suitable value of the difference between the CTAT and PTAT currents across resistor 202, until the output voltage at this second temperature corresponds to the reference voltage set at room temperature. The value of the CTAT and PTAT current difference can be controlled by control 101, with the control 108 on multiplexors 106,107 providing this current as either an increase or decrease to the voltage reference. FIG. 4 illustrates this process, with line 1 showing the reference voltage variation before the slope correction and line 3 showing the reference voltage after slope correction by the addition of a suitable value of the difference in CTAT and PTAT currents 2. After slope correction, the reference voltage has a zero temperature slope, so as to produce a constant reference voltage 3 over the temperature range.

The adjustment of a negative temperature slope is the converse of a positive slope adjustment. FIG. 5 shows a representation for an adjustment of a negative temperature slope. In this case, the slope can also be alleviated by adding or subtracting a suitable value of the PTAT and CTAT current difference across resistor 202, so as to provide a constant voltage reference over a temperature range. FIG. 5 shows the process of adjusting a negative temperature slope, with line 1 showing the reference voltage variation before the slope correction and with line 3 the reference voltage after slope correction by the addition of a suitable value of the difference in PTAT and CTAT currents 2. As in the case of positive slope adjustment, after slope correction the reference voltage should have zero temperature coefficient.

It will be appreciated that the performance of this second calibration step at the second temperature does not effect the value defined as a result of the first calibration. Similarly to the interface between the first calibration block 300 and the voltage reference, no change is effected to the base emitter voltage of the transistor 203.

It will be understood that all three blocks described above with reference to FIG. 6 can be provided using CMOS techniques and that it is not necessary to provide the voltage reference block using BJT circuits. The transistor of the voltage reference block may be provided as a parasitic transistor. Such implementation in CMOS is advantageous in that it is cheaper to achieve. However this technique can also be applied to trim reference voltages implemented on a bipolar process.

Figure 7:
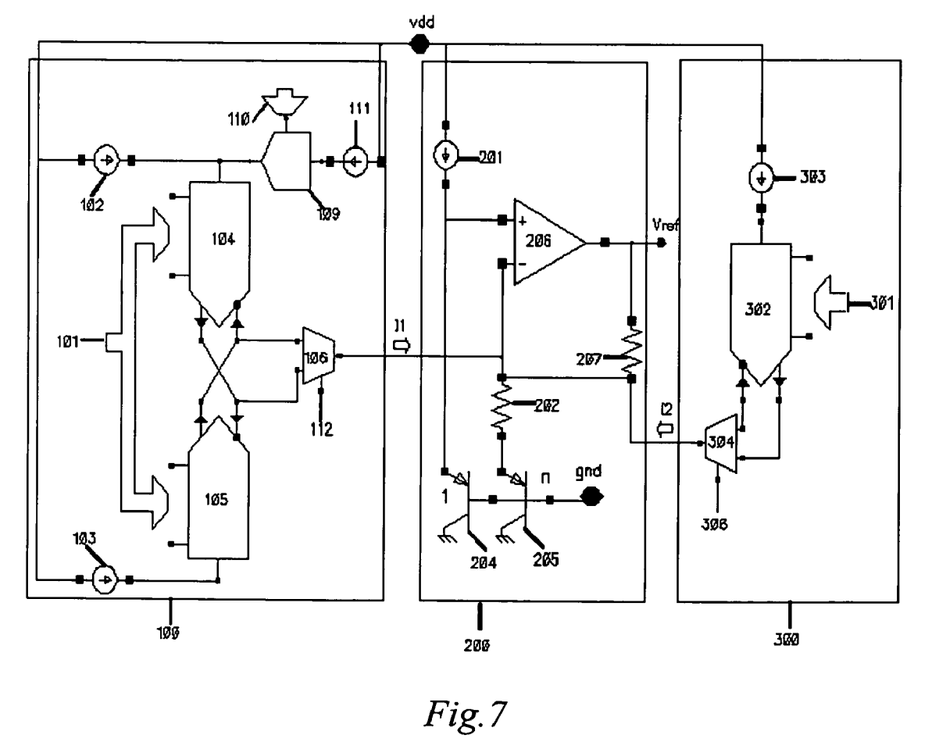
FIG. 7 is an example of a modification of the circuit of FIG. 6 for a bandgap voltage reference using an operational amplifier.

FIG. 7 shows a modification to both control blocks and also the voltage reference block of FIG. 6. In this embodiment, the voltage reference block 200 is implemented using an operational amplifier 206.

In the embodiment of FIG. 7, a first transistor 204 has its emitter connected to a current source 201 and is operating at a first current density. The first transistor is coupled via a common base to a second transistor 205 which is operating at second lower current density than the current density of transistor 204. The first transistor is also coupled to the non-inverting input of an amplifier 206. The inverting input of the amplifier is coupled via a first resistor 202 to the emitter of the second transistor 205. It is also coupled via a second resistor 207 to the output of the amplifier 206, at which the reference voltage Vref is monitored. As discussed above, the current through resistors 202 and 207 is a PTAT current and the output voltage is the base-emitter voltage of 204 (CTAT) plus the voltage drop over 207 (PTAT). When the PTAT and CTAT voltages are balanced, the voltage reference will have no temperature coefficient.

In this embodiment of FIG. 7 some of the components of first and second control blocks are also different from the previous embodiment of FIG. 6. The first control block no longer provides a simultaneous push pull interface to the voltage reference. Rather, a single multiplexor 304 is provided that, depending on the application of the input sign 306, may push or pull current from the common node of the two resistors 202, 207. This can, in a similar fashion to that described with reference to FIG. 6, effect a scaling of the voltage reference output to match a desired value. Once this scaling has been effected at a first temperature the first calibration step is complete, then the second control block can be used to adjust the slope in the second calibration step.

As shown in FIG. 7, the second control block differs in that only one multiplexor 106 is provided, such that the control block can only push or pull current from the common node of the two current DACs, 104 and 105 depending on the sign 112 controlling the current. After, optionally, balancing the PTAT and CTAT current sources 102, 103, at a first temperature, the temperature is increased to a second calibration temperature and the input code to the DACs 104, 105 is altered via control 101 until the voltage measured at Vref matches the desired output value. Similarly to that described with reference to FIG. 6, the control values may now be stored for operational purposes.

Figure 8:
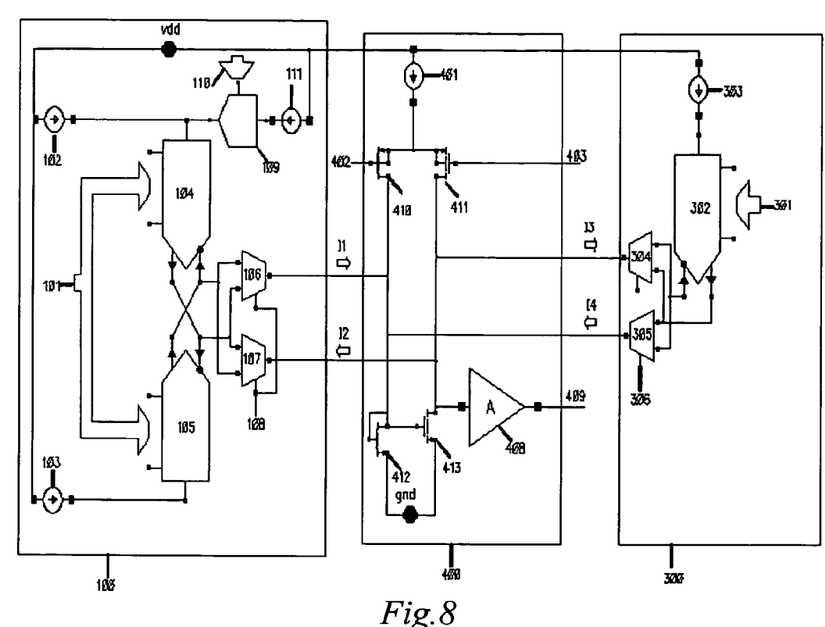
FIG. 8 is a schematic of a second embodiment of the invention adapted to compensate for the performance of an amplifier over a range of temperatures.

FIG. 8 shows a further application to the technique of the present invention, this time not restricted to voltage reference sources, but instead applied to compensate the offset of an amplifier. It is known that MOS amplifiers have a typical offset that drifts with temperature. The amplifier, which is the entire block 400, has been divided into first and second stages. The first stage of the amplifier is provided by four transistors 410, 411, 412, 413, and the second stage by the standard amplifier representation 408. Two inputs to the amplifier are provided by nodes 402, 403 and are coupled to the gates of a first and second transistor 410, 411. The sources of each of these transistors are coupled to a common current source 401. The drain of the first transistor is coupled to a third transistor 412 (whose gate and drain are coupled to one another) whereas the drain for the second transistor is coupled to the drain of a fourth transistor 413. The output of the amplifier is provided at an output node 409.

According to the present invention, the amplifier's offset can be compensated by the coupling of a first and second control block to the components of the amplifier. As shown in FIG. 8, the control blocks 100, 300 may be provided in a configuration adapted to provide the simultaneous push-pull current circulation that was described with reference to FIG. 6. The outputs of the multiplexors 304, 305 are coupled to common nodes of the second 411 and fourth 413 transistors, and the common nodes of the first 410 and third 412 transistors respectively. Similarly, the outputs of the multiplexors 107, 106 of the second control block 100 are also coupled to the same nodes respectively. The sign of the signal applied during the first and second calibration steps may be controlled by the sign controls 306, 108 interfacing with the multiplexors. As was discussed above with reference to the voltage reference sources, the present invention provides for a compensation for the temperature drift output of the amplifier by effecting first and second sets of control bits for the DAC's at the first and second temperatures, and using these as control parameters during normal operation of the circuitry.

Figure 9:
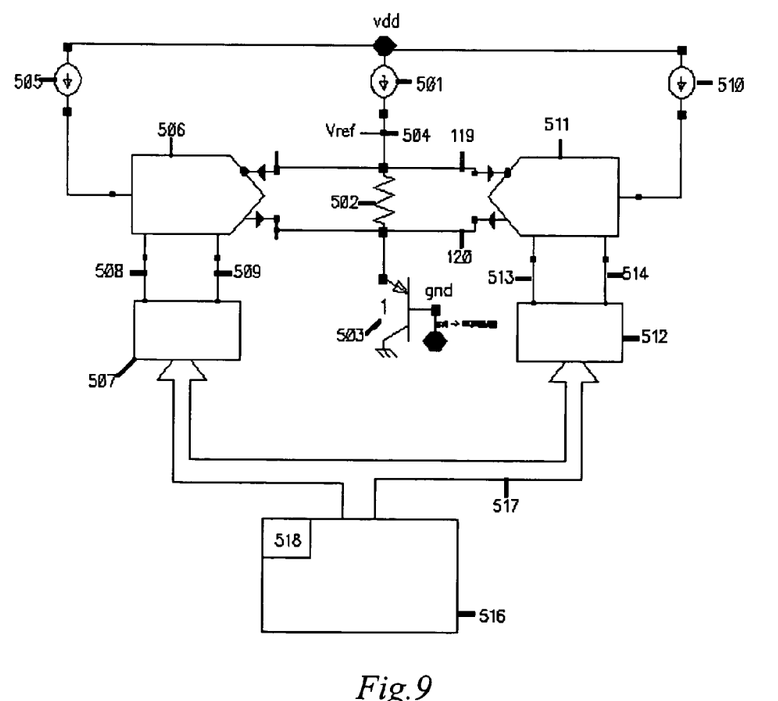
FIG. 9 is a schematic of a third embodiment of the invention adapted to provide for a compensation in the performance of a digital circuit.

FIG. 9 shows a further embodiment of the present invention implemented in a digital environment, for the purpose of providing a voltage reference based on a pair of two balanced PTAT and CTAT trimming currents. A traditional voltage reference circuit, as was previously described with reference to FIG. 1, is provided. The circuitry for such a reference includes a PTAT current source 501, coupled via a resistor 502 and a transistor 503 to ground. The voltage reference is taken from node 504. It will be appreciated that, similar to that described with reference to FIGS. 1 and 6, the circuitry for this voltage reference can be provided in CMOS as well as bipolar implementations. In the circuitry of FIG. 9, which is a modification to that of FIG. 6, the control features shown as control blocks 300, 100 are combined. Nevertheless, the principle of operation is the same.

A current source 505 forces a PTAT current into the input of a push-pull current DAC 506. The current DAC 506 is controlled at the digital inputs by the input code 508 and sign 509 so that its output current is circulated across resistor 502 to add or subtract an extra PTAT voltage across resistor 502. Similarly, a current source 510 forces a CTAT current to the input of a push-pull current DAC 511. The current DAC 511 is controlled at the digital inputs by the input code 513 and sign 514 so that its output current is circulated across resistor 502 to add or subtract a CTAT voltage across resistor 502.

The input codes, 508, 513 and the sign codes 509, 514 are stored into the two registers, 507 and 512. The registers 507 and 512 are connected to a digital control unit 516 via a bus 517. The digital control unit 516 has also a memory 518.

If the signs 509 and 514 are such that PTAT and CTAT trimming currents are added through the resistor 502, and the codes 508 and 513 represent fractions N1 and N2 respectively, the reference voltage changes from its initial value, $V_{init}$ to:

$$V_{ref} = V_{init} + (I_{PTAT}*N_1 + I_{CTAT}*N_2)r_{502} \quad (1)$$

As previously discussed, the reference voltage needs to be trimmed or calibrated in such a way than when absolute voltage is corrected, the slope is not affected and conversely when the references slope is corrected, the absolute value is not affected.

In order to check that at a first temperature, Tr, the PTAT and CTAT currents are balanced the following procedure can be performed. The signs 509 and 514 are set—one as logic "1" and one as logic "0", and input codes 508 and 513 are set to a common maximum value Nmax. N2 should then be digitally scaled by a coefficient Nd until the reference voltage remains at $V_{init}$ as Eq. 2 shows:

$$V_{ref} = V_{init} = (I_{PTAT}*N_{max} - I_{CTAT}*N_{max}*N_d)r_{502} = V_{init} \quad (2)$$

The coefficient Nd is then stored into the memory 518. At the same first temperature, the sign 514 is set to logic "1" and the reference voltage is scaled up or down by a corresponding input code $N_1$ to the desired value, $V_{des}$:

$$V_{ref} = V_{init} + (I_{PTAT}*N_1 - I_{CTAT}*N_1*N_d)r_{502} = V_{des} \quad (3)$$

The register 507 can then be loaded with the code Ni and the register 512 is loaded with the code N1*Nd.

At the second temperature, if the reference voltage changes, the register 507 is changed from N1 to N1+N3 and the register 512 is changed from N1*Nd to (N1−N3)*Nd until the reference voltage remains at the desired value Vdes. Accordingly, the reference voltage is:

$$V_r = V_{init} + (I_{PTAT}*N_1 + I_{CTAT}*N_1*N_d + I_{PTAT}*N_3 - I_{CTAT}*N_3*N_d)r_{502} = V_{des} \quad (4)$$

It can be seen from Eq. 4, that at the first temperature the last two terms in the brackets cancel each other and the reference voltage remains at the desired value, Vdes as required.

One advantage of the embodiment according to FIG. 9 is that only two current sources and adjustment DACs are required. This results in a circuit of a smaller size and lower power. Another advantage is the fact that the balancing of the PTAT and CTAT currents is done digitally, and therefore provides a more robust implementation.

It will be understood that the hereinbefore description has been based on the assumption that temperature drift is a linear effect. In reality, such effects normally include a bow effect or quadratic feature. It will be appreciated that such effects can be compensated or linearised by suitable techniques such as that described in, co-pending and co-assigned, U.S. application Ser. No. 10/375,359 filed on 27 Feb. 2003 and U.S. application Ser. No. 10/330,315 as filed 27 Dec. 2002.

The present invention provides a technique that compensates for the effect of temperature drift in operation of semiconductor circuits based on an assumption that the response is linear and that knowledge of two points on a line can define that response. The invention provides a first set of values that trim the operation of the circuitry to a pre-determined value, typically a value equal to the desired value for room temperature operation. At a second temperature, which is physically applied to the circuitry, a second value can be determined. The second value effects a rotation of the linearly defined output response to a value equal to that for the room temperature value. The two control values are then interfaced with the circuitry during normal operation to compensate for any effect of temperature drift. The invention has the useful property that the adjustment of the absolute value and the adjustment of the temperature coefficient are independent.

As the control values are externally applied, it will be understood that the compensation effect can be determined post-packaging, and as such the effect of any stress introduced during the packaging can be incorporated into the determined values. The invention is also advantageous in that the technique can be applied or re-applied at a later time so as to re-calibrate the operation and therefore compensate for any degradation due to time. Furthermore, the present invention enables the provision of an accurate reference circuit that can be implemented wholly in CMOS technology, obviating the need for incorporating BJT type devices.

Although the present invention has been described with reference to preferred embodiments it will be appreciated that it is not intended to limit the present invention except as may be deemed necessary in the light of the appended claims. It is further appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

The embodiments in the invention described with reference to the drawings comprise a computer apparatus and/or processes performed in a computer apparatus. However, the invention also extends to computer programs, particularly computer programs stored on or in a carrier adapted to bring the invention into practice. The program may be in the form of source code, object code, or a code intermediate source and object code, such as in partially compiled form or in any other form suitable for use in the implementation of the method according to the invention. The carrier may comprise a storage medium such as ROM, e.g., CD ROM, or magnetic recording medium, e.g., a floppy disk or hard disk. The carrier may be an electrical or optical signal which may be transmitted via an electrical or an optical cable or by radio or other means.

The invention is not limited to the embodiments hereinbefore described but may be varied in both construction and detail.

The words "comprises/comprising" and the words "having/including" when used herein with reference to the present invention are used to specify the presence of stated features, integers, steps or components but does not preclude the presence or addition of one or more other features, integers, steps, components or groups thereof.

The invention claimed is:

1. A method for compensating for temperature effects during operation of a semiconductor circuit comprising:
   scaling an output value of said circuit to a desired output value at a first temperature; and
   altering the temperature of the circuit from the first temperature to a second temperature and correcting said output value at the second temperature to match said desired output value, such that the correction which is to provide said desired output value at the second temperature does not change the output value at the first temperature, matching being effected by the addition or subtraction of the difference between two balanced trimming PTAT and CTAT currents.

2. The method of claim 1 wherein the step of scaling said output value is effected by the addition or subtraction of a constant voltage value.

3. The method of claim 2 wherein said constant voltage value is generated by forcing a constant current through a resistor of said circuit.

4. The method of claim 3 comprising generating said current from a balanced combined PIAT and CTAT current.

5. The method of claim 3 comprising generating said current from reflecting a reference voltage across said resistor.

6. The method of claim 1 wherein said trimming currents are such that at said first temperature the difference between each current is zero and the combined current value has a double slope compared to a slope value of each individual current.

7. The method of claim 1, comprising, between said scaling and said matching step the additional step of tuning of said trimming currents such that the difference between said PTAT and CTAT currents at said first temperature is equal to zero.

8. A semiconductor circuit adapted to provide compensation for temperature effects during operation comprising:
   means for scaling an output value of said circuit to a desired output value at a first temperature; and
   means for altering the temperature of the circuit from the first temperature to a second temperature and matching said output value, at the second temperature, to said desired output value, such that said desired output value at said first temperature remains unchanged, the matching being provided by the addition or subtracting of the difference between two balanced trimming PTAT and CTAT currents.

9. The circuit of claim 8 wherein the means for scaling said output comprises a multiplexor for adding or subtracting said output by a constant voltage value.

10. The circuit of claim 9 wherein the constant voltage value is generated by forcing a constant current through a resistor of said circuit.

11. The circuit of claim 10 wherein the value of the constant current is controlled by a current source coupled to a DAC, a value of a user controlled input code applied to said DAC to determine the value of the constant current.

12. The circuit of claim 11 wherein the addition or subtraction of the constant voltage value is controlled by at least one of said multiplexors coupled to two outputs of said DAC, to determine whether the constant voltage value is to be added or subtracted.

13. The circuit of claim 11 wherein the addition or subtraction of the constant voltage value is controlled by a second input to the said DAC.

14. The circuit of claim 11 wherein the values of the user controlled inputs codes are stored in memory.

15. The circuit of claim 8 wherein said trimming currents axe such that at said first temperature the difference between each current is zero and the combined current value has a double slope in the temperature domain compared to the slope of each individual trimming current.

16. The circuit of claim 15 wherein the values of said trimming currents providing said difference are stored in memory.

17. The circuit of claim 8 wherein the PTAT and CTAT trimming currents are controlled by a first and a second DAC, the output of said first and second DAC connected to at least one multiplexor, whereby a control signal applied to said multiplexor controls the addition or subtraction of said difference.

18. The circuit of claim 8 comprising tuning means for the tuning of said trimming currents such that the difference between said PTAT and CTAT currents at said first temperature is equal to zero.

19. The circuit of claim 18 wherein said tuning means comprises a tuning DAC coupled to a source of one of said currents, such that tuning may be achieved by adjusting a value of a user controlled input to said tuning DAC.

20. The circuit of claim 19 wherein the value of the user controlled input code is stored in memory.

21. A semiconductor circuit adapted to provide compensation for temperature effects during operation, the circuit comprising a digital control means for:
- digitally scaling an output voltage of said circuit to a desired output voltage value at a first temperature; and
- digitally matching said output voltage value, at a second temperature, to said desired output voltage value, such that said desired output voltage value at said first temperature remains unchanged,
- wherein a constant current is generated by a balanced combination of PTAT and CTAT current sources, each current source coupled to a DAC, the value of an input code applied to an input of each DAC determining, the value of the constant current, and wherein the addition or subtraction of the constant voltage value is controlled by a second input to each DAC.

22. The semiconductor circuit of claim 21 wherein said digital control means comprises a register, coupled to the inputs of each DAC, wherein the output values from said register determine the value of the input codes to each DAC.

23. The semiconductor circuit of claim 22 wherein said register is connected to a digital control unit and memory, the value of said input codes are stored in said memory, and the transfer of said input codes from memory to the register is controlled by said digital control unit.

* * * * *